United States Patent [19]

Vogel

[11] Patent Number: 5,085,972
[45] Date of Patent: Feb. 4, 1992

[54] ALKOXYALKYL ESTER SOLUBILITY INHIBITORS FOR PHENOLIC RESINS

[75] Inventor: Dennis E. Vogel, Lake Elmo, Minn.

[73] Assignee: Minnesota Mining and Manufacturing Company, St. Paul, Minn.

[21] Appl. No.: 618,212

[22] Filed: Nov. 26, 1990

[51] Int. Cl.$^5$ ............... G03C 1/492; C08F 2/46; C08J 3/28
[52] U.S. Cl. ................... 430/270; 430/905; 430/910; 522/31; 522/154
[58] Field of Search ............. 430/270, 905, 910; 522/31, 154

[56] References Cited

U.S. PATENT DOCUMENTS

| | | | |
|---|---|---|---|
| 4,101,323 | 7/1978 | Buhr et al. | 430/177 |
| 4,256,828 | 3/1981 | Smith | 430/270 |
| 4,708,925 | 11/1987 | Newman | 430/280 |

*Primary Examiner*—Marion E. McCamish
*Assistant Examiner*—Mark A. Chapman
*Attorney, Agent, or Firm*—Gary L. Griswold; Walter N. Kirn; Gregory A. Evearitt

[57] ABSTRACT

Solubility inhibitors for phenolic resins are disclosed, which when used in phenolic resin/iodonium salt positive printing plate constructions result in significantly increased sensitivity. The solubility inhibitors contain an alkoxyalkyl ester moiety. Also disclosed are presensitized lithogaphic plates containing the solubility inhibitors and a process for developing a photoimage.

11 Claims, No Drawings

ALKOXYALKYL ESTER SOLUBILITY INHIBITORS FOR PHENOLIC RESINS

FIELD OF THE INVENTION

This invention relates to photoimageable compositions, and more particularly, it relates to photoimageable compositions which contain solubility inhibitors for phenolic resins.

BACKGROUND OF THE INVENTION

Recent advances in the manipulation of text and graphics at the pre-press stage have created a need for lithographic plates suitable for exposure by low-energy devices such as laser scanners and projection cameras. These devices frequently emit actinic radiation over a narrow wavelength range, and accordingly, the sensitivity of a useful lithographic plate must not only be very high, so as to reduce scan times and exposure times to realistic levels, but also must also be sensitized to match the output of the exposure device.

Apart from the sensitivity requirements, various other attributes are necessary for such a resist to function as a high-speed positive plate. These include processing latitude, resolution, and press-life, all of which may be interrelated. Press-life is governed by (among other factors) the durability and adhesion of the resin which forms the image, hence the widespread use of phenolic resins coated on anodized aluminum, especially as these resins may frequently be post-baked (following development) to further enhance the image durability.

With regard to processing latitude, the ideal composition would allow the exposed areas of the coating to dissolve rapidly and completely in the developer, leaving the unexposed areas unaffected. In practice, this is rarely, if ever, achieved, largely as a result of the use of phenolic resins which are generally attacked, to some extent, even when not further solubilized by the alkaline developer. Part of the skill of positive print making lies in adjusting the development conditions so that attack on the unexposed areas is minimized while maintaining efficient wash-out of the exposed areas. Parameters that may be varied include time of development, temperature, and pH of the developer. At one extreme, if the development conditions are too aggressive, so much coating is lost from the resin image that press-life is reduced. At the other extreme, too mild development conditions lead to incomplete dissolution of the exposed areas causing background images to be made on press.

Over or under-development also affects the resolution obtained. High quality color printing requires the reproduction of half-tone images with dots in the range of about 3% to 97% obtained via a 150 line screen, or finer. Therefore, the development conditions must allow the shadow dots to be opened without excessive attack on the highlight dots which might cause them to be removed altogether. A convenient rule of thumb states that acceptable results are obtained if, under development conditions that produce complete dissolution of the exposed areas, coating weight loss from the unexposed areas is in the range of 5% to 15%.

From the point of view of convenience to the plate maker, it is desirable that the plate should possess sufficient development latitude to allow a range of developer solutions to be used, rather than being restricted to tightly controlled conditions.

Positive-acting resists generally comprise a resin binder, such as a phenolic resin, which is readily soluble in the developer solution, e.g., aqueous alkali. One or more light-sensitive compounds are added to the resin which have the property of retarding or totally suppressing the dissolution of the resin in the developer. By exposure to light of the appropriate wavelength and intensity, the light-sensitive compounds are converted to other chemical species which exert no insolubilizing action or may even assist solubilization. By this means, the original solubility of the resin is restored. This process is known as photosolubilization.

Virtually all the commercially available positive-acting resin-on-metal plates combine a phenolic resin with a light-sensitive diazo oxide as a solubility inhibitor. This technology is described, for example, by Brinckman et al. in *Unconventional Imaging Processes*; Focal Press, New York, 1987; pp 65-67. It has low sensitivity (ca. $10^6$ erg/cm$^2$, or 100 mJ/cm$^2$) and is not believed to be sensitized beyond its intrinsic sensitivity range centered in the near-ultraviolet.

U.S. Pat. No. 4,708,925 (Newman) discloses the combination of an onium, preferably iodonium, salt and a phenolic resin as a positive-acting photoresist. This represents a considerable advance both in terms of speed (ca. $10^5$ erg/cm$^2$ or 10 mJ/cm$^2$) and also in the capability to be sensitized throughout the entire visible spectrum and into the infrared. Nevertheless, further increases in speed are desirable, and the processing latitude of this system is insufficient for many applications.

The speed attainable from two-component resists of this type is limited by the lack of any amplification of the initial photochemical event. Negative-acting photopolymer resists achieve higher sensitivities by virtue of the fact that a single photon can initiate a chain reaction that produces tens or hundreds of insolubilizing bonds. Therefore, in recent years a number of photocatalytic solubilizing systems have been proposed for high speed positive-acting photoresists, each exploiting reactions catalyzed by photo-generated acid. One such system includes t-alkyl carbonate polymers as described by Willson (e.g., Jiang, Y.; Fréchet, J. M. J.; Willson, C. G. *Polymer Bulletin* 1987, 17, 1-6; Fréchet, J. M. J.; Bouchard, F.; Houlihan, F. M.; Kyyczka, B.; Eichler, E.; Clecak, N.; Willson, C. G. *J. Imag. Sci.* 1986, 30, 59-64. These systems contain t-alkyl carbonate groups either as pendant groups or within the polymer backbone, which cleave catalytically in the presence of photo-generated acid, causing a marked polarity change (release of polar groups) or depolymerization to soluble or volatile fragments. These materials are designed specifically for use as semiconductor masks, and are formulated simply with an onium salt as acid generator; i.e., they contain no additional phenolic resin as binder. Hence, they are not suitable to function as printing plates with a realistic run-length.

There are various known resist compositions which contain three essential ingredients, namely a resin binder, a photo-acid source, and a cleavable compound.

Research Disclosure No. 27,721 (May 1987) discloses the combination of the carbonate polymers described above with an onium salt and a resin binder which is an aromatic vinyl polymer (e.g., polystyrene), not a phenolic resin. The examples cited therein do not indicate how the plates are developed and the quoted sensitivity (Example 2) is 150 mJ/cm$^2$ (i.e., $1.5 \times 10^6$ erg/cm$^2$), which is very low.

Eur. Appl. 249,139 (Crivello) discloses the combination of a phenolic resin, an onium salt, and an acid-sensitive compound, where the last named is preferably a t-butyl ester or a t-butyl carbonate. The formulations are useful in the production of integrated circuits and the like. The highest sensitivities quoted in the visible or near-ultraviolet are 3 to $4 \times 10^5$ erg/cm$^2$ (30 to 40 mJ/cm$^2$).

Ger. Patent 3,601,264 (Aoai) and Jap. Kokai No. 62/059,949 disclose the combination of iodonium salt, phenolic resin binder, and respectively, a silyl ether compound, and a silyl ureido compound. No information is given on resolution or development latitude. Formulations containing the silyl ether compound are shown to be up to ten times faster than a diazo oxide control.

U.S. Pat. Nos. 3,915,704 (Limburg); 3,915,706 (Limburg); 3,917,483 (Limburg); 3,932,514 (Halcour); 4,247,611 (Buhr); 4,248,957 (Sander); 4,250,247 (Buhr); and 4,311,782 (Buhr) disclose phenolic resin binder, triazine derivatives and diazonium salts as acid sources, and respectively, polyacetals/polyketals, enol ethers, N-acyliminocarbonate, and polymeric orthoester cleavable compounds. According to the examples therein, offset plates produced by these methods require 20 sec exposure to a 5 kW lamp at 110 cm (15 sec in the case of poly(orthoesters)). There is no indication of the processing latitude or resolution.

Orthoesters have been used as acid-sensitive solubility inhibitors (e.g., see Ger. Appl. 2,610,842 (Roth)).

U.S. Pat. Nos. 4,101,323 (Roth) and 4,806,448 (Roth), and *Research Disclosures* No. 27,331 (Jan. 1987) disclose the combination of phenolic resin with an onium salt, together with cyclic acetals or ketals of β-ketocarbonyl compounds or poly(phthalaldehyde). Additionally, the Research Disclosure indicates that other cleavable polymeric compounds may be used as a third component, giving improved speed and process latitude, but no specific details are given. Offset plates disclosed in the cited U.S. patents required 60 sec exposure to a 5 kW source at 65 cm to clear 3 steps on a 0.15 increment gray scale. There is no teaching as to resolution or development latitude.

U.S. Pat. No. 3,779,778 (Bonham) discloses the combination of phenolic resin, acid source, and a variety of cleavable compounds, including pyranyl ethers of bisphenols. The acid source is a polyhalogen compound, preferably a polyhalogenated triazine derivative.

None of these prior art publications teach the importance of the developer resistance of the exposed material, or of how it may be maximized. The publications are only concerned with the photosolubility produced by the photocatalytic degradation of certain compounds.

SUMMARY OF THE INVENTION

The present invention provides a photoimageable composition which comprises: (a) a binder which is soluble in aqueous base; (b) an acid-sensitive solubility inhibitor comprising an alkoxyalkyl ester; and (c) a photochemical acid progenitor.

This invention teaches that alkoxyalkyl esters can be used effectively as solubility inhibitors in phenolic photosolubilization compositions. These materials have the additional advantage of being soluble in low pH developers after cleavage due to the formation of carboxylic acids. Most other solubility inhibitors form weaker acids, typically phenolics which require the use of higher pH development. The alkoxyalkyl esters of the present invention are also more acid sensitive than solubility inhibitors known in the art, which translates to increased speed when used in lithographic applications. Another advantage to these esters is that they have increased thermal stability and hence, have a good shelf-life.

In another embodiment of the present invention, a presensitized lithoplate is provided. The presensitized lithoplate contains a lithographic support coated with the above disclosed photoimageable composition.

In still another embodiment, a process for the development of a photoimage is provided. The process comprises the steps of exposing a presensitized lithoplate to light under a pattern (e.g., positive or negative) and thereafter developing the resulting image with aqueous alkaline solution whereby the areas unexposed are removed. In a preferred embodiment, light is ultraviolet light and the aqueous alkaline solution is sodium metasilicate.

Other aspects and advantages of the present invention will be apparent from the detailed disclosure, the examples, and the claims.

DETAILED DESCRIPTION OF THE INVENTION

The alkoxyalkyl ester used in the solubility inhibitor of the present invention is represented by the following formula:

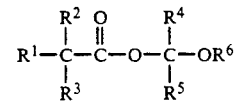

wherein:
R$^1$, R$^2$, and R$^3$ individually represent alkyl having from 1 to 18 carbon atoms or phenyl, the phenyl optionally substituted with halogen, methyl, or ethyl; or any two of R$^1$, R$^2$, and R$^3$ can together form a cyclic ring structure having from 5 to 18 carbon atoms; or R$^1$, R$^2$, and R$^3$ taken together can form a polycyclic structure having from 8 to 18 carbon atoms; preferably R$^1$ is hydrogen and R$^2$ and R$^3$ are phenyl;

R$^4$ and R$^5$ are individually lower alkyl having from 1 to 6 carbon atoms or hydrogen with the proviso that at least one of R$^4$ and R$^5$ must be hydrogen; preferably R$^4$ is hydrogen and R$^5$ is methyl or hydrogen; and R$^6$ is lower alkyl having from 1 to 6 carbon atoms; and R$^6$ is preferably methyl or ethyl; or R$^5$ and R$^6$ may together form a cyclic alkyl ether group, preferably tetrahydrofuryl or tetrahydropyranyl.

Photochemical acid progenitors of the present invention comprise diaryliodonium salts or halomethylated triazines.

Preferably, the diarylidonium salt is represented by one of the following general formulae:

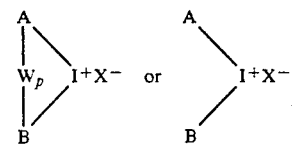

wherein:

A and B are individually substituted or unsubstituted aryl groups with a total of from 4 to 20 carbon atoms;

W is selected from the group consisting of: a carbon to carbon bond; oxygen, sulfur;

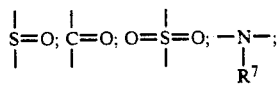

and $R^8$—C—$R^9$;

wherein $R^7$ is aryl or acyl and $R^8$ and $R^9$ independently represent H or alkyl groups having from 1 to 18 carbon atoms;

$X^-$ is an anion such that HX is an acid of $pK_a \leq 3$. Examples of suitable anions are halide, bisulfate, halogen containing complex anions such as hexafluorophosphate, tetrafluoroborate, hexafluoroantimonate, trifluoroacetate, methanesulfonate, trifluoromethanesulfonate, p-toluenesulfonate, etc.; and p is 0 or 1.

Preferably, the triazines employed herein are halogenated derivatives of 2,4,6-trimethyl-s-triazine having from 1 to 9 to halogen substituents, and may be additionally substituted with 1 to 3 additional substituents chosen from alkyl having from 1 to 6 carbon atoms (e.g., methyl, ethyl, hexyl), alkoxy having from 1 to 6 carbon atoms (e.g., methoxy, isopropoxy, hexoxy), aryl having from 6 to 10 carbon atoms (e.g., phenyl, naphthyl), heteroaryl having from 4 to 10 carbon atoms (e.g., furanyl, pyrazolyl, quinolinyl), nitro, sulfoxy, and cyano.

Suitable phenolic resins are phenolic resins which are soluble in aqueous alkaline solutions. The phenolic resin may be chosen from a wide range of resins capable of forming tack-free coatings. Mixtures of two or more types of resin may be used, including those possessing additional alkyl substituents on the aromatic rings. Resole TM, Novolak TM, and urethane-Novolak TM resins are preferred. A urethane-Novolak TM resin is most preferred.

In addition to the basic three components, useful printing plate formulations normally contain a sensitizer for the iodonium salt in order to increase the sensitivity of the system towards radiation of a wavelength longer than that of the intrinsic sensitivity of the iodonium salt itself. Many such compounds are known including those in the following classes: diphenylmethane including substituted diphenylmethane, such as amino-substituted diphenylmethane, xanthene, acridine, methine and polymethine (including oxonol, cyanine and merocyanine), thiazole, thiazine, azine, aminoketone, porphyrin, aromatic polycyclic hydrocarbon, p-substituted aminostyryl compounds, aminotriazylmethane, polyarylene, polyarylpolyene, 2,5-diphenylisobenzofuran, 2,5-diarylcyclopentadiene, diarylfuran, diarylthiofuran, diarylpyrrole, polyarylphenylene, coumarin and polyaryl-2-pyrazoline. The addition of a sensitizer to the system renders it sensitive to any radiation falling within the absorption spectrum of the sensitizer. The efficiency of the irradiation increases as in coincides with $\lambda_{max}$ of the sensitizer.

However, sensitizers suitable for use in the present invention must not interfere with the insolubilizing action of the iodonium salt nor scavenge the photogenerated acid necessary for the solubilizing process, and so dyes possessing easily protonated groups are unlikely to be suitable. A preferred class of sensitizers are the polycyclic aromatic hydrocarbons and their derivatives (e.g., anthracene, 2-ethylanthracene, 9,10-diethoxyanthracene, 2-ethyl-9,10-diethoxyanthracene, etc.).

The sensitizer is preferably present in an amount that makes maximum use of the incident light. This varies according to the layer thickness, extinction coefficient of the dye, and the extent to which its absorption spectrum matches the output of the exposing source, as is well understood by those skilled in the art. Generally the sensitizer should be present in amounts up to 15% by weight of the total solids composition. Where the output of the exposing source does not match the maximum absorption of the dye an amount in excess of this may be employed.

In most applications, the sensitizer is chosen so as to match as closely as possible the output of the intended exposure device, but in one embodiment the sensitizer is chosen so that the sensitivity is confined to the near UV region, with essentially no response to light of wavelengths greater than 400 nm. This provides a plate that may be handled under white-light conditions, rather than requiring the yellow lighting normally used in the press-room, but can be imaged by conventional exposing devices with a realistic exposure time. Many commercially available exposing devices for printing plates emit predominantly in the blue region (above 400 nm), with a relatively weak UV component, but such is the sensitivity shown by formulations in accordance with the present invention that inefficient exposures of this sort can be tolerated without unduly lengthening exposure time. Sensitizers suitable for this application include anthracene and its 2-ethyl derivative.

The composition may additionally contain small amounts of other ingredients commonly incorporated in printing plate formulations (e.g., dyes or pigments that enhance the visibility of the post-exposure or post-development image, surfactants to improve the coatability, and oils or resins to improve ink receptivity).

The composition will normally be coated on a hydrophilic substrate for use as a lithographic printing plate. A wide variety of coating solvents may be used, including lower alcohols, ketones, ethers, and esters. Particularly suitable solvents are methyl ethyl ketone and methyl isobutyl ketone. Mixtures of solvents may also be used. Any of the well known coating techniques may be used, for example coating with wire-wound bars, spin coating, knife coating, dip coating, roller coating, etc.

Typical lithographic support materials which are useful in the invention include supports such as zinc, anodized aluminum, copper, and specially prepared metal and paper supports; superficially hydrolyzed cellulose ester films; polymeric supports such as polyolefins, polyesters, polyamide, and the like.

The supports can also be sub-coated with known subbing materials such as copolymers and terpolymers of vinylidene chloride with acrylic monomers (such as acrylonitrile and methyl acrylate) and unsaturated dicarboxylic acids (such as itaconic acid or acrylic acid), carboxymethylcellulose, polyacrylamide, and similar polymeric materials.

The support can also carry a filter or antihalation layer, such as one comprising a dyed polymer layer which absorbs the exposing radiation-sensitive layer and eliminates unwanted reflection from the support. A yellow dye in a polymeric binder, such as one of the polymers referred to above as suitable sub-coatings, is an especially effective antihalation layer when ultraviolet radiation is employed as the exposing radiation.

In the manufacture of a printing plate, after coating the composition is dried briefly at an elevated temperature (e.g., 3 minutes at 85° C.). The resulting coating is surprisingly resistant to dissolution in alkaline developer. The combination of iodonium salt and cleavable compound engenders a greater developer resistance than would be predicted from the behavior of the individual components.

The plate is then exposed imagewise, using any suitable light source. Because of the high sensitivity shown by the plate, it is suitable for exposure by projection cameras and laser scanners. In the light-struck areas, a proportion of the iodonium salt is photolyzed, generating the corresponding strong Bronsted acid HX. This acid catalyzes the decomposition of the alkoxyalkyl ester releasing diphenylacetic acid, a lower aldehyde, and a lower alcohol, all of which are soluble in aqueous alkali. Solubility inhibition by residual iodonium is slight because relatively small quantities of iodonium are present, even before photolysis takes place. Since the cleavage of solubility inhibitor is a catalytic process, only a small proportion of the iodonium salt need be photolyzed in order to completely destroy the developer resistance.

After exposure the plate may be heated, (e.g., to 85° C. for 1 minute) to ensure completion of the cleavage reaction prior to development in aqueous alkaline developer and removal of the exposed areas of the coating. A wide range of alkaline solutions may be used, e.g., sodium hydroxide or trisodium phosphate solution, but the preferred developer is aqueous sodium metasilicate in the concentration range of 2 to 10 wt %, optionally containing small amounts of surfactants and/or organic solvents. After development, the plate is mounted on-press to print copies in the normal manner.

Compositions of the invention may also be used as positive photoresists for the preparation of metal-clad printed circuit boards, e.g., copper sheet laminated to an epoxy resin board. In this instance the copper is coated with the photosensitive composition. After exposure the solubilized material would be removed leaving an integral mask. Unprotected areas of copper would then be removed by etching such as with aqueous ferric chloride solution.

The compositions of the invention may also be used to protect other materials such as amorphous $SiO_2$. Silica is often used in the fabrication of electronic devices and integrated circuitry, and the contact patterns for these devices are often defined through photomasks.

The compositions of the invention may also be used in other applications, e.g., proofing constructions in which the compositions contain a high loading of a color-proofing pigment.

EXAMPLES

The materials prepared in the following examples were analyzed by one or more of the following techniques and gave results consistent with the assigned identities: $^1H$, $^{27}Al$, $^{13}C$ nuclear magnetic resonance, boiling point, elemental analysis, mass spectroscopy, infrared spectroscopy.

All materials were obtained from Aldrich Chemical Company (Milwaukee, WI) unless otherwise indicated.

EXAMPLE 1

Diphenylacetic acid methoxymethyl ester was prepared in the following manner: to a mixture of 10.0 g (47.1 mmol) diphenylacetic acid and 4.0 ml (4.16 g, 51.8 mmol) of chloromethyl methyl ether in 50 ml of dichloromethane cooled to −5° C. was added 7.2 ml (5.24 g, 51.8 mmol) of triethylamine in 50 ml dichloromethane. The mixture was allowed to warm to room temperature and stir overnight at which point the reaction mixture was washed with aqueous sodium bicarbonate, dried with $MgO-MgSO_4$, and concentrated in vacuo. The residue was distilled to give 7.25 g (28.3 mmol, 60% yield) of the corresponding methoxymethyl ester, bp 135°–140° C./0.1 mm Hg.

EXAMPLE 2

Diphenylacetic acid 2-ethoxyethyl ester was prepared in the following manner: To a mixture of 2.0 g (9.4 mmol) of diphenylacetic acid in 10 ml of dichloromethane was added 1.1 ml (0.82 g, 11.4 mmol) of ethyl vinyl ether. The mixture was allowed to stir overnight at which point the reaction mixture was washed with aqueous sodium bicarbonate, dried with $MgO-MgSO_4$, and concentrated in vacuo to give 1.7 g (6.0 mmol, 63% yield) of the corresponding ethoxy ethyl ester.

Diphenylacetic acid 2-tetrahydrofuranyl and 2-tetrahydropyranyl esters were prepared in a similar manner by replacing ethyl vinyl ether with with 2,3-dihydrofuran and 3,4-dihydro-2H-pyran, respectively.

EXAMPLE 3

A positive-acting lithographic plate was prepared by mixing the following components:

| | | |
|---|---|---|
| 60 parts | m-cresol Novolak TM (Borden Chemical, #E46-0170, Columbus, OH) | |
| 9 parts | diphenylacetic acid methoxymethyl ester | |
| 3.6 parts | diphenyliodonium hexafluorophosphate | |
| 1.8 parts | 9,10-diethoxyanthracene | |
| 300 parts | methyl ethyl ketone | |

The solution was coated on aluminum for positive printing plates 1-A-1 with a number 7 Meyer bar (0.016 mm wet thickness, R&D Specialties, Webster, N.Y.) and heated to 85° C. for 5 min, then exposed through a 21 step wedge in a Berkey Ascor 24″×28″ vacuum printer (Woodside, N.Y.) device with a 2 kw diazo bulb at a distance of 50 cm for 20 sec followed by development with a solution of:

| | |
|---|---|
| 5.6 parts | sodium metasilicate pentahydrate |
| 0.1 parts | Necal TM NF (GAF Corp., Wayne, NJ) |
| 94.3 parts | deionized water | for two minutes gave 11 steps (sensitivity 4 $mJ/cm^2$) at 405 nm.

EXAMPLE 4

A positive-acting lithographic plate was prepared by mixing the following components:

| | |
|---|---|
| 300 parts | a solution of 30 parts urethane-Novolak TM in 70 parts MEK (described in U.S. Pat. No. 4,571,374 at col. 6, lines 10–23) |
| 9.7 parts | diphenylacetic acid ethoxyethyl ester |
| 4.7 parts | diphenyliodonium hexafluorophosphate |

| 2.3 parts | 9,10-diethoxyanthracene |
|---|---|
| 190 parts | methylethyl ketone | and coated on aluminum with a #7 Meyer bar (0.016 mm wet thickness), dried, exposed and developed as described in Example 3 to give 7 clear steps. This corresponds to a sensitivity of 7 mJ/cm$^2$ at 405 nm.

EXAMPLE 5

The preparation of 2-ethylhexanoic acid tetrahydropyran-2-yl ester was carried out in the following manner: In 33.6 mL of 3,4-dihydro-2H-pyran, 15.5 g (108 mmol) of 2-ethylhexanoic acid was heated to 60° C. for 24 hours and the mixture was extracted with aqueous sodium bicarbonate. The organic layer was dried (MgSO$_4$) and concentrated in vacuo to give 4.12 g (18.0 mmol, 17% yield) of the corresponding tetrahydropyranyl ether.

EXAMPLE 6

A positive-acting lithographic plate was prepared by mixing the following components:

| 60 parts | m-cresol Novolak ™ (Borden Chemical, E#46-0170 Columbus, OH) |
|---|---|
| 9 parts | tetrahydropyran-2-yl 2-ethylhexanoate |
| 3.6 parts | diphenyliodonium hexafluorophosphate |
| 1.8 parts | 9,10-diethoxyanthracene |
| 175 parts | methyl ethyl ketone |

The solution was coated on aluminum for positive printing plates 1-A-1 with a number 7 Meyer bar (0.016 mm wet thickness), dried exposed (40 sec) and developed as described in example 3 to give 4 steps.

Reasonable variations and modifications are possible from the foregoing disclosure without departing from the spirit or scope of the present invention as defined in the claims.

What is claimed is:

1. A photoimageable composition comprising:
   (a) a binder soluble in aqueous base;
   (b) an acid sensitive solubility inhibitor comprising an ester of the formula:

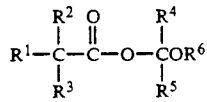

wherein:
R$^1$, R$^2$, and R$^3$ individually represent alkyl having from 1 to 18 carbon atoms or phenyl, the phenyl optionally substituted with halogen, methyl, or ethyl; or any two of R$^1$, R$^2$, and R$^3$ can together form a cyclic ring structure having from 5 to 18 carbon atoms; or R$^1$, R$^2$, and R$^3$ together may form a polycyclic structure having from 8 to 18 carbon atoms;

R$^4$ and R$^5$ are individually C$_1$ to C$_6$ alkyl or hydrogen, with the proviso that at least one of R$^4$ and R$^5$ must be hydrogen; and R$^6$ is lower alkyl having from 1 to 6 carbon atoms or R$^5$ and R$^6$ may together form a cyclic alkyl ether group.

2. A photoimageable composition according to claim 1 wherein said binder comprises a phenolic residue.

3. A photoimageable composition according to claim 1 wherein R$^1$ and R$^2$ are phenyl; R$^3$ is hydrogen; R$^4$ is hydrogen; and R$^5$ is methyl or hydrogen; and R$^6$ is methyl or ethyl.

4. A photoimageable composition according to claim 1 wherein said ester is chosen from the group consisting of methoxymethyl ester, 1-ethoxyethyl ester, 2-tetrahydropyranyl ester, and 2-tetrahydrofuranyl ester.

5. A photoimageable composition according to claim 1 wherein said photochemical acid progenitor is a diaryliodonium salt or a halogenated triazine.

6. A photoimageable composition according to claim 5 wherein said diaryliodonium salt is one presented by the general formula:

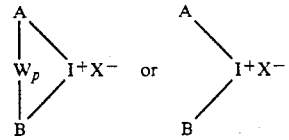

wherein
A and B are individually substituted or unsubstituted aryl groups with a total of from 4 to 20 carbon atoms;
W is selected from the group consisting of: a carbon to carbon bond; oxygen, sulfur;

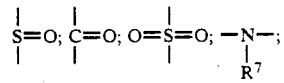

and R$^8$—C—R$^9$;
wherein
R$^7$ is aryl or acyl, and R$^8$ and R$^9$ are individually hydrogen, or alkyl groups having from 1 to 18 carbon atoms;
p is 0 or 1; and
X$^-$ is an anion such that HX is an acid of pK$_a$ ≦ 3.

7. A photoimageable composition according to claim 6 wherein X$^-$ is an anion such that HX is an acid of pK$_a$ ≦ 1.

8. A photoimageable composition according to claim 6 wherein X$^-$ is a halogen containing complex anion.

9. A photoimageable composition according to claim 5 wherein said halogenated triazine is a 2,4,6-trimethyl-s-triazine.

10. A photoimageable composition according to claim 1 further comprising a sensitizer for said photochemical acid progenitor.

11. A photoimageable composition according to claim 10 wherein said sensitizer is a polycyclic aromatic hydrocarbon.

* * * * *